(12) United States Patent
Han

(10) Patent No.: US 9,946,314 B1
(45) Date of Patent: Apr. 17, 2018

(54) HEAT DISSIPATION DEVICE FOR DISPLAY CARD

(71) Applicant: EVGA CORPORATION, New Taipei (TW)

(72) Inventor: Tai-Sheng Han, New Taipei (TW)

(73) Assignee: EVGA CORPORATION, New Taipei (TW)

(*) Notice: Subject to any disclaimer, the term of this patent is extended or adjusted under 35 U.S.C. 154(b) by 0 days.

(21) Appl. No.: 15/381,131

(22) Filed: Dec. 16, 2016

(30) Foreign Application Priority Data

Oct. 7, 2016 (TW) .............................. 105215332 U

(51) Int. Cl.
*G06F 1/20* (2006.01)
*H05K 7/20* (2006.01)

(52) U.S. Cl.
CPC ........... *G06F 1/20* (2013.01); *H05K 7/20154* (2013.01); *H05K 7/20263* (2013.01);
(Continued)

(58) Field of Classification Search
CPC ............... H01L 2924/00; H01L 23/473; H01L 2924/00014; H01L 2224/16225; H01L 2224/32225; H01L 27/1214; H01L 27/124; H01L 23/427; H01L 23/467; H01L 27/12; H01L 27/1225; H01L 27/1222; H01L 27/1251; H01L 29/42384; H01L 27/3276; H01L 21/67109; H01L 27/1255; H01L 29/78696; H01L 21/6833; H01L 2224/73253; G06F 1/20; G06F 2200/201; G06F 1/206; G06F 1/203; G06F 1/181; G06F 2200/203; G06F 1/26; G06F 1/1632; G06F 1/3203; G09G 2330/021; G09G 2320/0252; G09G 3/3648; G09G 3/342; G09G 2340/0435; G09G 2340/16; G09G 2300/0426; G09G 2320/0261; G09G 2320/106; G09G 2300/0852; G09G 2310/024; G09G 3/3659; G09G 3/3677; H05K 7/20772; H05K 7/20836; H05K 7/20809; H05K 7/20781; H05K 7/20236;
(Continued)

(56) References Cited

U.S. PATENT DOCUMENTS

| 4,935,864 A * | 6/1990 | Schmidt | .................. H01L 23/38 |
| | | | 257/467 |
| 6,567,269 B2 * | 5/2003 | Homer | .................... G06F 1/203 |
| | | | 165/80.4 |

(Continued)

*Primary Examiner* — Adam B Dravininkas
(74) *Attorney, Agent, or Firm* — Leong C. Lei

(57) ABSTRACT

The heat dissipation device is for a display card and includes an air cooling member on a power supply circuit of the display card, a water cooling member on a processing element of the display card, and an auxiliary member disposed to a side of the water cooling member adjacent to the display card. The auxiliary member has at least an opening corresponding to the processing element and an extension piece extended away from the opening corresponding to a memory of the display card. As such, the heat from power supply circuit, the processing element, and the memory is respectively dissipated by the air cooling member, the water cooling member, and the auxiliary member and its extension piece, thereby achieving significantly enhanced heat dissipation performance.

8 Claims, 4 Drawing Sheets

(52) U.S. Cl.
CPC ..... H05K 7/20272 (2013.01); H05K 7/20409 (2013.01); H05K 7/20436 (2013.01)

(58) Field of Classification Search
CPC ........... H05K 7/20254; H05K 7/20218; H05K 7/20763; H05K 7/20827; H05K 7/20272; H05K 7/2079; H05K 5/067; H05K 7/20745; H05K 7/20336; H05K 7/20736; H05K 7/1497; H05K 7/20281; H05K 7/203; H05K 7/20727
See application file for complete search history.

(56) References Cited

U.S. PATENT DOCUMENTS

| | | | | |
|---|---|---|---|---|
| 6,587,343 | B2 * | 7/2003 | Novotny | F25D 19/00 165/104.33 |
| 6,671,177 | B1 * | 12/2003 | Han | H01L 23/467 165/80.3 |
| 7,149,087 | B2 * | 12/2006 | Wilson | H01L 23/473 165/80.4 |
| 7,209,356 | B2 * | 4/2007 | Lee | H01L 23/427 165/104.21 |
| 7,365,989 | B2 * | 4/2008 | Peng | G06F 1/20 165/104.33 |
| 7,495,923 | B2 * | 2/2009 | Peng | G06F 1/20 165/104.33 |
| 7,529,090 | B2 * | 5/2009 | Peng | G06F 1/20 165/104.33 |
| 7,580,262 | B2 * | 8/2009 | Chou | G06F 1/20 165/104.26 |
| 7,782,617 | B2 * | 8/2010 | Li | G06F 1/20 165/104.33 |
| 8,159,819 | B2 * | 4/2012 | Memon | G06F 1/20 165/185 |
| 9,471,115 | B2 * | 10/2016 | Richard | G06F 1/203 |
| 9,606,589 | B2 * | 3/2017 | Gallina | G06F 1/185 |
| 2006/0050483 | A1 * | 3/2006 | Wilson | H01L 23/473 361/702 |
| 2007/0125522 | A1 * | 6/2007 | Stefanoski | F28D 1/024 165/104.21 |
| 2007/0133178 | A1 * | 6/2007 | Han | G06F 1/20 361/719 |
| 2008/0310105 | A1 * | 12/2008 | Cheng | H01L 23/427 361/695 |
| 2009/0147476 | A1 * | 6/2009 | Han | G06F 1/20 361/697 |
| 2010/0128431 | A1 * | 5/2010 | Eriksen | G06F 1/20 361/679.47 |
| 2011/0279969 | A1 * | 11/2011 | Memon | G06F 1/20 361/679.47 |
| 2016/0273996 | A1 * | 9/2016 | Alshinnawi | H05K 7/20272 |

\* cited by examiner

HEAT DISSIPATION DEVICE FOR DISPLAY CARD

BACKGROUND OF THE INVENTION (a) Technical Field of the Invention

The present invention is generally related to heat dissipation, and more particular to a heat dissipation device for a display card.

(b) Description of the Prior Art

Electronic appliances inevitably would produce heat. The heat may reduce the performance of, or damage, the electronic appliances, or even causes fire. Effectively dissipating heat is therefore a major issue for electronic appliances.

The independent display card commonly found in computers is also equipped with heat dissipation components. A conventional heat dissipation component may involve heat dissipating fins on a display chip of the display card, and a fan on the fins. The fins draw heat from the display chip, and the fan introduces cool air among the fins.

Such a conventional heat dissipation component is usually of limited performance. In addition, there are other heat producing elements on the display card but are not covered by the conventional heat dissipation component. Therefore it is common that the display card suffers degraded performance after a period of operation and after an amount of heat is accumulated.

SUMMARY OF THE INVENTION

A major objective of the present invention is to enhance the heat dissipation of display card so as to maintain the display card's performance.

To accomplish the objective, the present invention teaches a novel heat dissipation device for a display card, which includes at least an air cooling member configured on a power supply circuit of the display card, at least a water cooling member configured on a processing element of the display member, and at least an auxiliary member configured to a side of the water cooling member adjacent to the display card. The auxiliary member has at least an opening corresponding to the water cooling member and the processing element, and at least an extension piece extended away from the opening corresponding to a memory of the display card.

Therefore, the heat from the power supply circuit, the processing element, and the memory of the display card is completely collected and respectively dissipated by the air cooling member, the water cooling member, the auxiliary member with the opening and the extension piece. The present invention therefore achieves significantly enhanced heat dissipation for the display card so that its performance may be effectively maintained. The prior art's problems of limited heat dissipation and failure to cover various components of the display card are effectively resolved.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
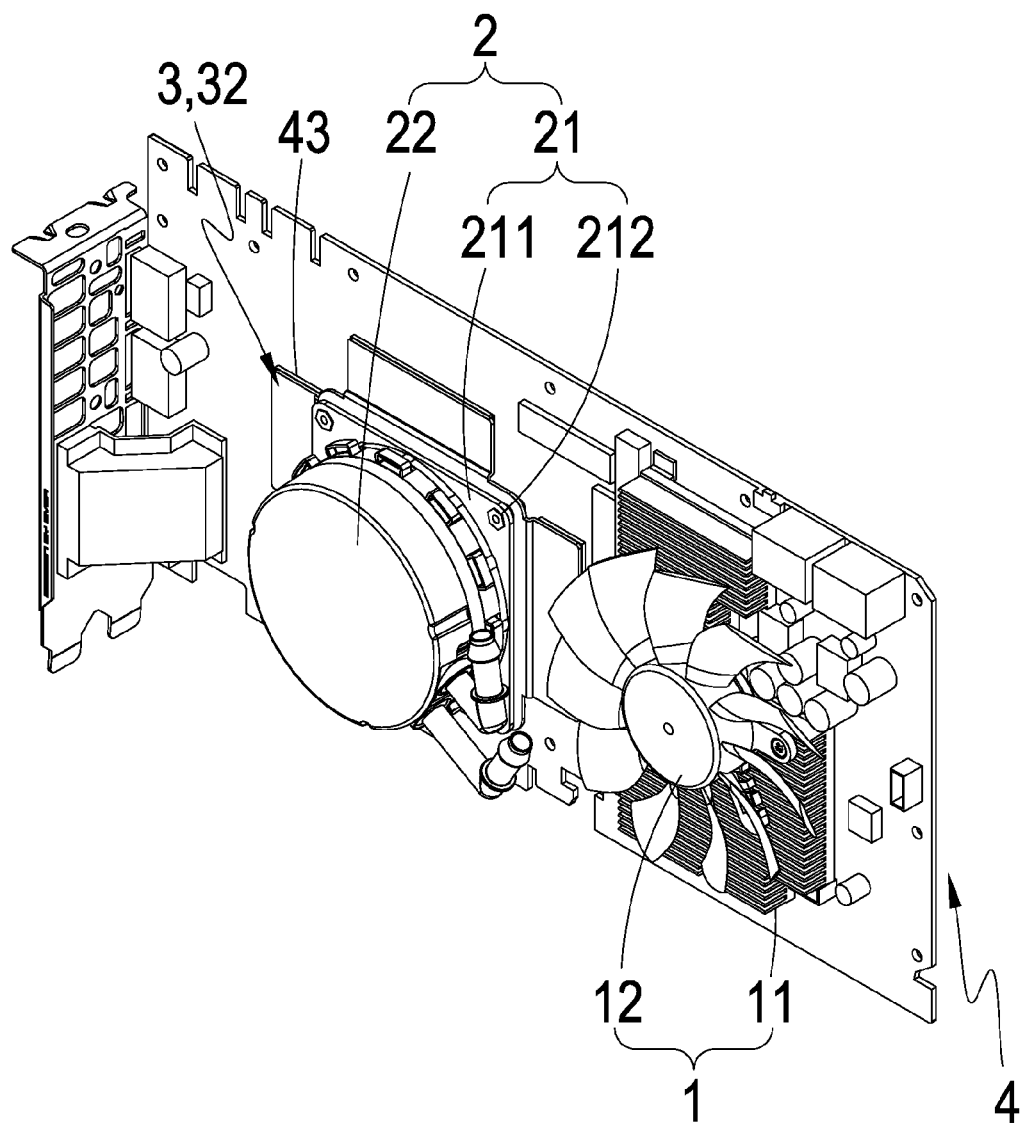
FIG. 1 is a perspective diagram showing a heat dissipation device according to an embodiment of the present invention.
Figure 2:
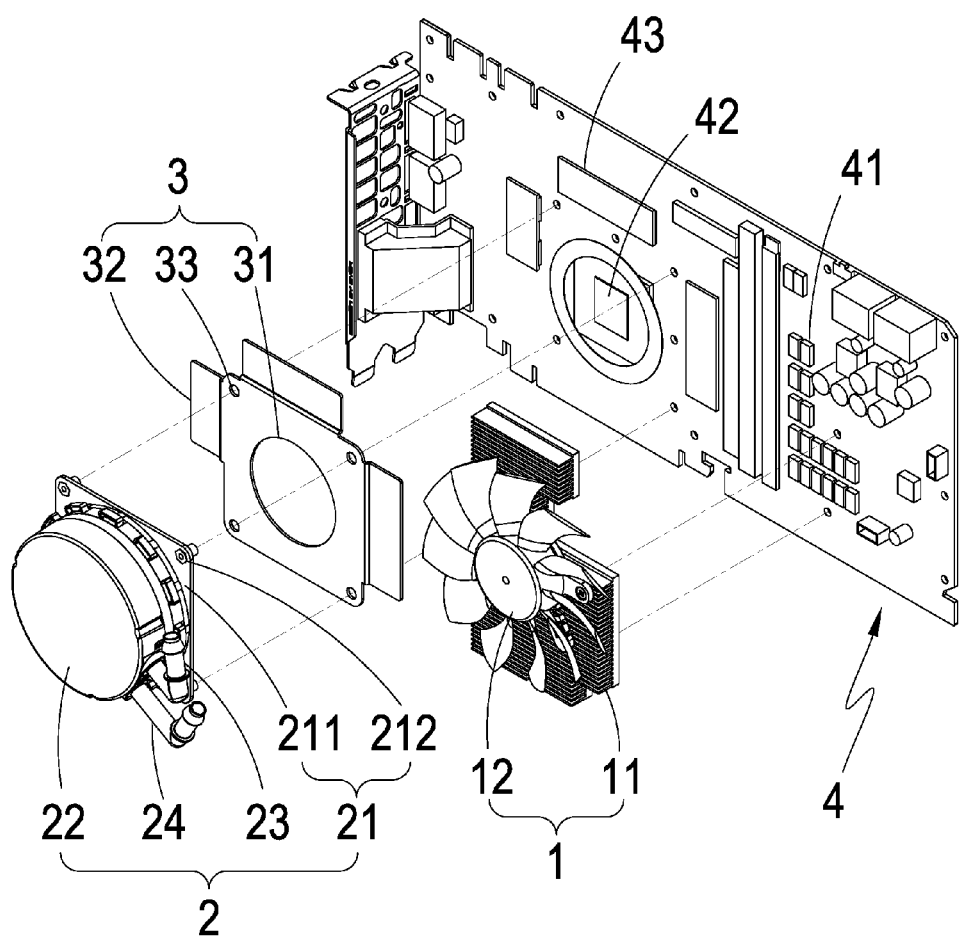
FIG. 2 is a perspective breakdown diagram showing the heat dissipation device of FIG. 1.
Figure 3:
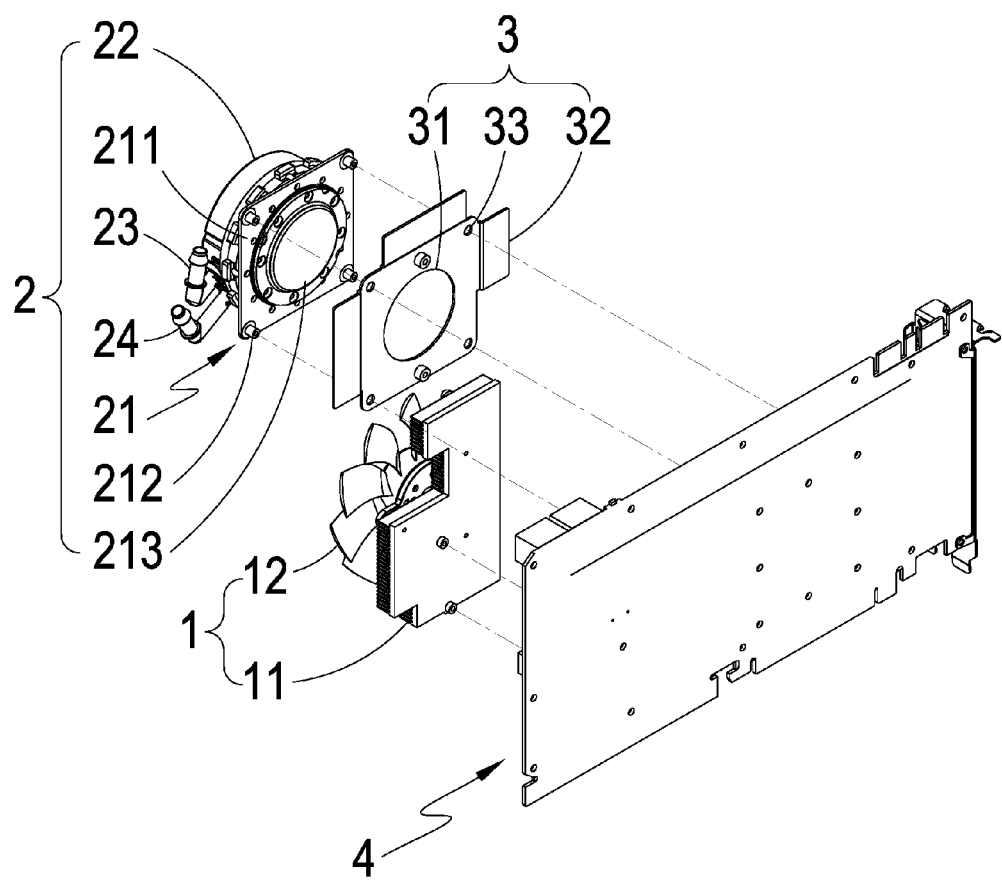
FIG. 3 is another perspective breakdown diagram showing the heat dissipation device of FIG. 1.

FIGS. 1 to 3 are perspective diagrams showing a heat dissipation device according to an embodiment of the present invention. As illustrated, the heat dissipation device is for a display card 4 and includes at least an air cooling member 1, at least a water cooling member 2, and at least an auxiliary member 3. The air cooling member 1 is configured on a power supply circuit 41 of the display card 4, and includes a fin set 11 on the power supply circuit 41, and a fan assembly 12 on the fin set 11.

The water cooling member 2 is configured on a processing element 42 of the display card 4, and includes at least a heat transfer base 21, at least a pump 22 on the heat transfer base 21, and at least a coolant storage space confined between the heat transfer base 21 and the pump 22, at least an intake pipe 23 connecting the coolant storage space, and at least an outlet pipe 24 connecting the coolant storage space. The heat transfer base 21 includes at least a heat transfer element 213 made of at least copper adjacent to the processing element 42.

The auxiliary member 3 is disposed to a side of the water cooling member 2 adjacent to the display card 4. The auxiliary member 3 has at least an opening 31 corresponding to the processing element 42 and the water cooling member 2. The auxiliary member 3 further has an extension piece 32 extended outward away from the opening 31 corresponding to a memory 43 of the display card 4. The auxiliary member 3 with its opening 31 and extension piece 32 is integrally formed of at least copper through a fast and inexpensive pressing means. For a display card whose memory 43 is located differently, only the extension piece 32 needs to be modified accordingly. There is no need to modify the air and water cooling members 1 and 2, achieving low cost and convenient production.

The heat transfer base 21 has at least a flange 211 with a number of first fastening elements 212. The auxiliary member 3 has a number of second fastening elements 33, each correspond to one of the first fastening elements 212. The first and second fastening elements 212 and 33 jointly affix the heat transfer base 21 onto the display card 4. Please note that there may be other fastening means and the above embodiment is only exemplary.

Figure 4:
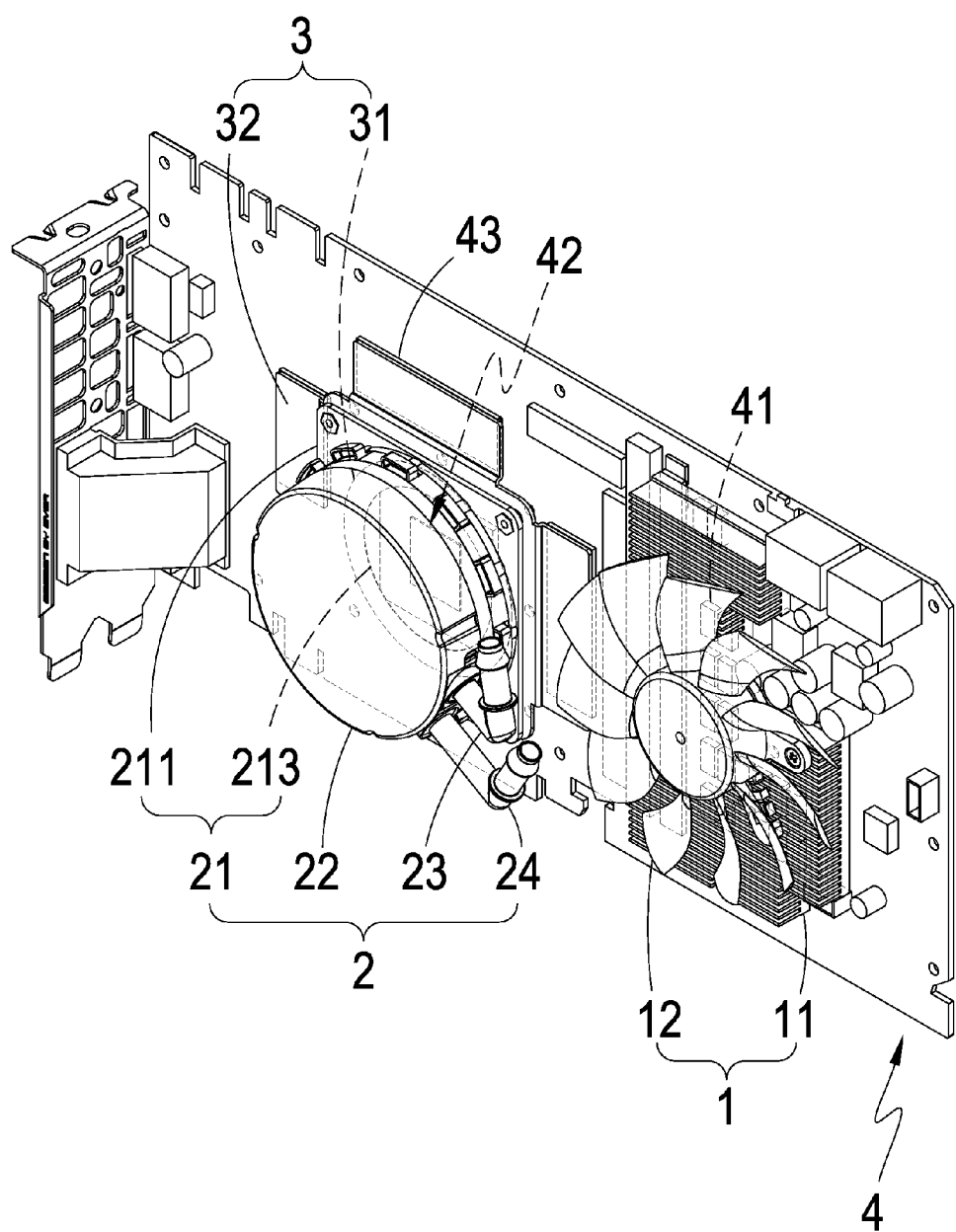
FIG. 4 is a perspective schematic diagram showing the heat dissipation device of FIG. 1.

As further shown in FIG. 4, the air cooling member 1 is configured on the power supply circuit 41, the fin set 11 draws the heat from the power supply circuit 41, and the fan assembly 12 introduces air flow among the fins of the fin set 11 to carry the heat away.

On the other hand, the water cooling member 2 contacts with and absorbs heat from the processing element 42 through the heat transfer element 213 of the heat transfer base 21 and the opening 31. The pump 22 drives coolant from the intake pipe 23 into the coolant storage space, and then out of the coolant storage space through the outlet pipe 24, so as to carry the heat absorbed by the heat transfer base 21. The heat from the memory 43 is collected by the auxiliary member 3 and its extension piece 32, and is carried away also by the coolant through the heat transfer base 21 and the flange 211.

The present invention therefore achieves significantly enhanced heat dissipation for the display card 4 so that its performance may be effectively maintained.

The gist of the present invention lies in the following.

Firstly, the heat from the various components of the display card is completely collected and respectively dissipated by the air cooling member 1, the water cooling member 2, the auxiliary member 3, the opening 31, and the extension piece 32.

Secondly, the integrally formed auxiliary member 3 with its opening 31 and the extension piece 32 may be conveniently adapted to fit different display cards, so as to achieve economic and fast production.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. A heat dissipation device for a display card, comprising at least an air cooling member configured on a power supply circuit of the display card;
at least a water cooling member configured on a processing element of the display card; and
at least an auxiliary member configured to a side of the water cooling member adjacent to the display card, where the auxiliary member has at least an opening corresponding to the water cooling member and the processing element, and at least an extension piece extended away from the opening corresponding to a memory of the display card.

2. The heat dissipation device according to claim 1, wherein the air cooling member comprises at least a fin set configured on the power supply circuit, and a fan assembly configured on the fin set.

3. The heat dissipation device according to claim 1, wherein the water cooling member comprises at least a heat transfer base configured on the processing element, at least a pump on the heat transfer base, and at least a coolant storage space confined between the heat transfer base and the pump, at least an intake pipe connecting the coolant storage space, and at least an outlet pipe connecting the coolant storage space.

4. The heat dissipation device according to claim 3, wherein the heat transfer base has at least a flange and a plurality of first fastening elements on the flange; the auxiliary member further has a plurality of second fastening elements, each corresponding to one of the first fastening elements; and the first and second fastening elements jointly affix the heat transfer base onto the display card.

5. The heat dissipation device according to claim 3, wherein the heat transfer base further has at least a heat transfer element adjacent to the processing element.

6. The heat dissipation device according to claim 5, wherein the heat transfer element is made of at least copper.

7. The heat dissipation device according to claim 1, wherein the auxiliary member is made of at least copper.

8. The heat dissipation device according to claim 1, wherein the auxiliary member and the extension piece is integrally formed through pressing.

\* \* \* \* \*